United States Patent [19]

Tani et al.

[11] Patent Number: 5,418,193
[45] Date of Patent: May 23, 1995

[54] COPPER PASTE FOR FORMING CONDUCTIVE THICK FILM

[75] Inventors: Hiroji Tani; Kazuhito Oshita; Tetsuya Ikeda, all of Kyoto, Japan

[73] Assignee: Murata Manufacturing Co., Ltd., Kyoto, Japan

[21] Appl. No.: 238,256

[22] Filed: May 4, 1994

[30] Foreign Application Priority Data

May 7, 1993 [JP] Japan .................. 5-106984

[51] Int. Cl.$^6$ ............ C03C 8/18; C03C 8/16
[52] U.S. Cl. .................. 501/19; 501/20; 252/512; 106/1.13; 106/1.12
[58] Field of Search ............ 252/512; 501/19, 20; 106/1.13, 1.12

[56] References Cited

U.S. PATENT DOCUMENTS 5,035,837  7/1991  Saiki et al. ............... 501/19

FOREIGN PATENT DOCUMENTS 1-167907  7/1989  Japan .
3-167713  7/1991  Japan .
4-277406  10/1992  Japan .

OTHER PUBLICATIONS

CA 112:110052g Copper Post In Electrically Conductive Films. Abstract for Koho JP 01-167907 Jul. 3, 1989.

*Primary Examiner*—Mark L. Bell
*Assistant Examiner*—C. M. Bonner
*Attorney, Agent, or Firm*—Ostrolenk, Faber, Gerb & Soffen

[57] ABSTRACT

Disclosed herein is copper paste for forming a conductive thick film, which contains 80 wt. % to 95 wt. % of spherical first copper powder of 1 $\mu$m to 10 $\mu$m in mean particle diameter, 0.5 wt. % to 15 wt. % of second copper powder of less than 1 $\mu$m in mean particle diameter, and 1 wt. % to 15 wt. % of glass frit of 0.5 $\mu$m to 2.0 $\mu$m in mean particle diameter respectively as solid components. A conductive thick film obtained by applying the copper paste onto a substrate and baking the same exhibits excellent solderability as well as high adhesive strength to the substrate, and this adhesive strength is excellently maintained even if the thick film is exposed to a heat hysteresis.

3 Claims, No Drawings

COPPER PASTE FOR FORMING CONDUCTIVE THICK FILM

BACKGROUND OF THE INVENTION

1. Field of the Invention

The present invention relates to copper paste for forming a conductive thin film by baking, and more particularly, it relates to copper paste containing glass frit.

2. Description of the Background Art

Copper paste is employed as a conductive thick film for providing an electrode or an interconnection pattern on an electric insulating substrate or an electronic component body, for example. The copper paste is applied onto the insulating substrate or the electronic component body, and thereafter baked to form a conductive thick film.

The copper paste is generally obtained by mixing copper powder, glass frit and an organic vehicle. This copper paste first has an advantage of a low material cost. Further, a conductive thick film which is formed by the copper paste has excellent solderability, and hardly causes migration, which is easily caused in a conductive thick film formed by silver paste.

In general, the conductive thick film must have strong adhesive strength with respect to a surface to be formed, in addition to excellent solderability and small specific resistance. In order to simply improve the adhesive strength, the content of the glass frit is effectively increased. When the content of the glass frit is increased, however, the solderability is reduced and the specific resistance is increased. Further, such an increased content of the glass frit disadvantageously leads to reduction of the adhesive strength when the conductive thick film is exposed to heat hysteresis caused by soldering or the like. In Japanese Patent Application No. 62-326452 (1987) (Japanese Patent Application Laying-Open No. 1-167907 (1989), the assignee has proposed copper paste for forming a conductive thick film, which can solve these problems.

The copper paste proposed in the above application, which is obtained by mixing copper powder, glass frit and organic vehicle, contains not only spherical copper powder of 1 $\mu$m to 10 $\mu$m in particle diameter, but copper powder of less than 1 $\mu$m in particle diameter. Due to such addition of the copper powder of less than 1 $\mu$m in particle diameter, the thick film is densified after baking, to prevent penetration of solder and improved adhesive strength between the same and a surface to be provided with the thick film.

The inventors have noted the glass frit in order to attain further preferable properties while maintaining the aforementioned preferable characteristics of the copper paste, and improved the glass frit, to complete the present invention.

Copper paste which is of interest to the present invention is also disclosed in Japanese Patent Application Laying-Open Nos. 3-167713 (1991) and 4-277406 (1992), in addition to the aforementioned Japanese Patent Application Laying-Open No. 1-167907 (1989). However, none of these documents notes the particle diameter of the glass frit, although the same notes that of the copper powder. Generally employed glass frit is 4.0 $\mu$m in mean particle diameter.

Summary of the Invention

An object of the present invention is to provide copper paste for forming a conductive thick film, which can further improve adhesive strength of the conductive thick film to a surface to be provided with the same.

Another object of the present invention is to provide copper paste for forming a conductive thick film, which can effectively maintain the aforementioned adhesive strength also after the conductive thick film is exposed to a heat hysteresis.

Copper paste for forming a conductive thick film according to the present invention is obtained by mixing solid components including spherical first copper powder of 1 $\mu$m to 10 $\mu$m in mean particle diameter, second copper powder of less than 1 $\mu$m in mean particle diameter, and glass frit of 0.5 $\mu$m to 2.0 $\mu$m in mean particle diameter, and an organic vehicle.

The copper paste according to the present invention contains glass frit having a mean particle diameter of 0.5 $\mu$m to 2.0 $\mu$m, which is smaller than that of conventionally employed glass frit of 4.0 $\mu$m in mean particle diameter. Thus, the activity of the glass frit is improved when the copper paste is baked or fired. Consequently, adhesive strength between a conductive thick film obtained by the baking and a surface to be provided with the same is improved, and this adhesive strength can be excellently maintained also after the thick film is exposed to heat hysteresis. Thus, it is possible to prevent the conductive thick film as obtained from being deteriorated by heat in soldering or by heat generated following employment, thereby obtaining an electronic component such as a hybrid IC or a multilayer capacitor, for example, having a highly reliable conductive thick film.

According to the present invention, the mean particle diameter of the glass frit is preferably selected in a range of 0.5 $\mu$m to 1.5 $\mu$m, more preferably in a range of 0.5 $\mu$m to 1.0 $\mu$m. Thus, the mean particle diameter is preferably minimized. The lower limit of 0.5 $\mu$m is that of the mean particle diameter of glass frit which is economically obtained through ordinary crushing.

According to the present invention, the overall solid components preferably include 80 wt. % to 95 wt. % of the first copper powder, 0.5 wt. % to 15 wt. % of the second copper powder, and 1 wt. % to 15 wt. % of the glass frit respectively.

The foregoing and other objects, features, aspects and advantages of the present invention will become more apparent from the following detailed description of the present invention.

DESCRIPTION OF THE PREFERRED EMBODIMENTS

A method of preparing copper paste for forming a conductive thick film according to an embodiment of the present invention is now described.

(1) Crushing of Glass Frit 300 g of lead borosilicate zinc glass ($PbO$-$B_2O_3$-$ZnO$-$Al_2O_3$-$SiO_2$ glass) frit was loaded in an alumina pot of 1000 $cm^3$ in volume with 1 kg of alumina balls of 5 mm in diameter and 500 $cm^3$ of pure water, and crushed with a vibrating mill for 0, 2, 5, 20 and 50 hours respectively. Each glass frit obtained by the crushing was dried in a thermostat which was set at 150° C. for 24 hours, and thereafter passes through a screen of 200 meshes. Table 1 shows the relationship between the crushing times and mean particle diameters of the glass frit samples as obtained.

TABLE 1

| Crushing Time (hr) | 0 | 2 | 5 | 20 | 50 |
|---|---|---|---|---|---|
| Mean Particle Diameter of Glass Frit | 4.0 | 2.5 | 1.5 | 1.0 | 0.5 |

(2) Pasting

Respective components were prepared in the following composition ratios and mixed by 3 rolling mill to obtain copper paste:

| | |
|---|---|
| spherical copper powder of 1.5 μm in mean particle diameter | 76 wt. % |
| copper powder of 0.05 μm in mean particle diameter | 3 wt. % |
| glass frit | 7 wt. % |
| organic vehicle | 14 wt. % |

Then, the copper paste prepared in the aforementioned manner was applied onto alumina substrates by screen printing, dried at 150° C. for 10 minutes, and then fired in a nitrogen atmosphere of 600° C., to obtain evaluation samples of conductive thick films.

First, solderability of each sample was evaluated by dipping the alumina substrate in a solder bath and visually observing the state of the solder adhering onto the copper thick film. As the result, every sample exhibited excellent solderability, regardless of the particle diameter of the glass frit.

Further, adhesive strength of the copper thick film to the substrate was evaluated as to each sample. The adhesive strength was evaluated by vertically soldering a lead wire to the copper thick film in an area of 2 by 2 mm□ and measuring the maximum load which was provided before the copper thick film was separated from the substrate when the lead wire was pulled along the axial direction. In addition, heat deterioration strength and thermal shock strength were also evaluated as to each sample for adhesive strength evaluation. The heat deterioration strength, which is adhesive strength after heat aging, was evaluated by leaving each sample in a thermostat of 150° C. for 100 hours, and 200 hours respectively, and thereafter carrying out the aforementioned tensile test. On the other hand, the thermal shock strength, which is adhesive strength after a heat cycle, was evaluated by carrying out heat cycles of holding each sample at −55° C. for 30 minutes and thereafter holding the same at 125° C. for 30 minutes of 50, 100 and 200 cycles, respectively, and thereafter carrying out the aforementioned tensile test.

Tables 2 and 3 show results of such evaluation of the heat deterioration strength, and the thermal shock strength respectively.

TABLE 2

| | (Heat Deterioration Strength) | | |
|---|---|---|---|
| Mean Particle Diameter of Glass Frit (μm) | Initial Strength (kgf/2 × 2 mm□) | 100 hr Heat Deterioration Strength (kgf/2 × 2 mm□) | 200 hr Heat Deterioration Strength (kgf/2 × 2 mm□) |
| *1) 4.0 | 2.6 | 1.7 | 1.4 |
| *2) 2.5 | 2.8 | 1.9 | 1.7 |
| 1.5 | 3.0 | 2.3 | 2.0 |
| 1.0 | 3.2 | 2.5 | 2.1 |
| 0.5 | 3.4 | 2.7 | 2.2 |

TABLE 3

| | (Thermal Shock Strength) | | | |
|---|---|---|---|---|
| Mean Particle Diameter of Glass Frit (μm) | Initial Strength (kgf/2 × 2 mm□) | 50 cycles (kgf/2 × 2 mm□) | 100 cycles (kgf/2 × 2 mm□) | 200 cycles (kgf/2 × 2 mm□) |
| *1) 4.0 | 2.6 | 0.9 | 0.7 | 0.5 |
| *2) 2.5 | 2.8 | 1.1 | 0.9 | 0.7 |
| 1.5 | 3.0 | 1.3 | 1.2 | 1.0 |
| 1.0 | 3.2 | 1.5 | 1.3 | 1.1 |
| 0.5 | 3.4 | 1.7 | 1.4 | 1.2 |

Referring to Tables 2 and 3, the sample *1) corresponds to conventional copper paste, and the sample *2), which is not conventional, is out of the scope of the present invention. When the mean particle diameter of the glass frit was set in the range of 0.5 μm to 2.0 μm, the heat deterioration strength and the thermal shock strength were increased by 30% to 100% as compared with those of the conventional copper paste. It is understood from Tables 2 and 3 that the heat deterioration strength and the thermal shock strength are improved when the mean particle diameter of the glass frit is in a range of 0.5 μm to 1.5 μm, and further improved when the mean particle diameter is in a range of 0.5 μm to 1.0 μm.

According to the present invention, solid components including spherical first copper powder of 1 μm to 10 μm in mean particle diameter, second copper powder of less than 1 μm in mean particle diameter and glass frit of 0.5 μm to 2.0 μm in mean particle diameter, and an organic vehicle are mixed for obtaining copper paste for forming a conductive thick film. The blending ratios of the first copper powder, the second copper powder and the glass frit in the solid components contained in the copper paste are preferably so selected that the first copper powder is 80 wt. % to 95 wt. %, the second copper powder is 0.5 wt. % to 15 wt. % and the glass frit is 1 wt. % to 15 wt. % with respect to the overall solid components. In order to decide these preferable ranges, copper paste samples having various blending ratios shown in Table 4 were prepared.

TABLE 4

| | Copper Powder of 1.5 μm in Mean Particle Diameter | Copper Powder of 0.05 μm in Mean Particle Diameter | Glass Frit of 1.5 μm in Mean Particle Diameter | Organic Vehicle | Initial Strength | 100 hr Heat Deterioration Strength | 100 Cycle Thermal Shock Strength |
|---|---|---|---|---|---|---|---|
| 1 | 76(88.4) | 3(3.5) | 7(8.1) | 14 | 3.0 | 2.3 | 1.2 |
| 2 | 76(88.4) | 0(0)* | 10(11.6) | 14 | 2.7 | 1.3 | 0.7 |
| 3 | 76(87.8) | 0.5(0.6) | 10(11.6) | 13.5 | 2.8 | 2.0 | 1.0 |
| 4 | 76(88.4) | 5(5.8) | 5(5.8) | 14 | 3.0 | 2.4 | 1.3 |
| 5 | 70(82.3) | 10(11.8) | 5(5.9) | 15 | 3.0 | 2.6 | 1.2 |
| 6 | 65(76.5) | 15(17.6)* | 5(5.9) | 15 | — | — | — |

TABLE 4-continued

| | Copper Powder of 1.5 μm in Mean Particle Diameter | Copper Powder of 0.05 μm in Mean Particle Diameter | Glass Frit of 1.5 μm in Mean Particle Diameter | Organic Vehicle | Initial Strength | 100 hr Heat Deterioration Strength | 100 Cycle Thermal Shock Strength |
|---|---|---|---|---|---|---|---|
| 7 | 76(95.6) | 3(3.8) | 0.5(0.6)* | 20.5 | 1.8 | 0.7 | 0.4 |
| 8 | 76(95.0) | 3(3.8) | 1(1.2) | 20 | 2.4 | 1.6 | 1.0 |
| 9 | 65(78.3) | 3(3.6) | 15(18.1)* | 17 | — | — | — |
| 10 | 80(88.9) | 3(3.3) | 7(7.8) | 10 | 2.9 | 2.2 | 1.1 |
| 11 | 85(95.5)* | 3(3.4) | 1(1.1) | 11 | 2.3 | 1.4 | 0.8 |
| 12 | 65(79.3)* | 10(12.2) | 7(8.5) | 18 | 2.5 | 1.2 | 0.9 |

Referring to Table 4, numerical values shown in the columns of "Copper Powder of 1.5 μm in Mean Particle Diameter" (i.e., the first copper powder), "Copper Powder of 0.05 μm in Mean Particle Diameter" (i.e., the second copper powder), "Glass Frit of 1.5 μm in Mean Particle Diameter" and "Organic Vehicle" indicate blending ratios (wt. %), and particularly those in parentheses indicate those of only solid components. Further, respective ones of "Initial Strength", "100 hr Heat Deterioration Strength" and "100 Cycle Thermal Shock Strength" were evaluated by the same methods as those for the corresponding ones shown in Tables 2 and 3.

It is understood from Table 4 that the copper paste preferably contains 80 wt. % to 95 wt. % of the first copper powder (1.5 μm in mean particle diameter), 0.5 wt. % to 15 wt. % of the second copper powder (0.05 μm in mean particle diameter) and 1 wt. % to 15 wt. % of the glass frit (1.5 μm in mean particle diameter) with respect to the overall solid components.

The preferable blending ratio of the first copper ratio is set in the range of 80 wt. % to 95 wt. %, since the heat deterioration strength is extremely reduced when the same is less than 80 wt. % (sample 12) while the thermal shock strength is extremely reduced if the same exceeds 95 wt. % (sample 11).

The preferable blending ratio of the second copper powder is set in the range of 0.5 wt. % to 15 wt. %, since the heat deterioration strength is extremely reduced when the same is less than 0.5 wt. % (sample 2) while solderability is extremely deteriorated if the same exceeds 15 wt. % (sample 6). The solderability was deteriorated in sample 6 due to oxidation of copper on the surface of the copper thick film.

The preferable blending ratio of the glass frit is set in the range of 1 wt. % to 15 wt. %, since the initial strength is low when the same is less than 1 wt. % (sample 7) while solderability is extremely deteriorated when the same exceeds 15 wt. % (sample 9). Reduction of the initial strength was caused in the sample 7 due to insufficiency in the amount of the glass frit, while the solderability was deteriorated in the sample 9 since the surface of the copper thick film was covered with glass.

Referring to Table 4, asterisked (*) numerical values indicate blending ratios of the respective components bringing the aforementioned various disadvantages.

What is claimed is:

1. Copper paste for forming a conductive thick film containing solid components including 80 wt. % to 95 wt. % of spherical first copper powder of 1 μm to 10 μm in mean particle diameter, 0.5 wt. % to 15 wt. % of second copper powder of less than 1 μm in mean particle diameter and 1 wt. % to 15 wt. % of glass frit of 0.5 μm to 2.0 μm in mean particle diameter, and an organic vehicle.

2. Copper paste in accordance with claim 1, wherein the mean particle diameter of said glass frit is selected in a range of 0.5 μm to 1.5 μm.

3. Copper paste in accordance with claim 2, wherein the mean particle diameter of said glass frit is selected in a range of 0.5 μm to 1.0 μm.

* * * * *